United States Patent
Furukawa

(10) Patent No.: US 7,291,861 B2
(45) Date of Patent: Nov. 6, 2007

(54) SOLID-STATE IMAGING DEVICE, METHOD FOR DRIVING THE SAME, METHOD FOR MANUFACTURING THE SAME, CAMERA, AND METHOD FOR DRIVING THE SAME

(75) Inventor: Junichi Furukawa, Kanagawa (JP)

(73) Assignee: Sony Corporation (JP)

( * ) Notice: Subject to any disclaimer, the term of this patent is extended or adjusted under 35 U.S.C. 154(b) by 155 days.

(21) Appl. No.: 11/188,893

(22) Filed: Jul. 26, 2005

(65) Prior Publication Data

US 2006/0027837 A1    Feb. 9, 2006

(30) Foreign Application Priority Data

Aug. 3, 2004    (JP)    ............. 2004-226264

(51) Int. Cl.
*H01L 29/04* (2006.01)
(52) U.S. Cl. ............. 257/72; 257/59; 257/88; 257/222; 257/225; 257/E27.154; 257/E27.13
(58) Field of Classification Search ............. None
See application file for complete search history.

(56) References Cited

U.S. PATENT DOCUMENTS 4,481,522 A * 11/1984 Jastrzebski et al. ......... 257/229
4,543,601 A * 9/1985 Harada et al. ........... 348/219.1
6,018,169 A * 1/2000 Tohyama ................. 257/222

FOREIGN PATENT DOCUMENTS

JP    06-268192    9/1994

* cited by examiner

*Primary Examiner*—Thomas Dickey
*Assistant Examiner*—Scott R. Wilson
(74) *Attorney, Agent, or Firm*—Rader Fishman & Grauer PLLC; Ronald P. Kananen

(57) ABSTRACT

A solid-state imaging device includes a two-dimensional array of photosensor sections on a semiconductor substrate, and a vertical transfer section including two-layer vertical transfer electrodes. The photosensor sections store signal charges generated by photoelectric conversion. The vertical transfer section reads signal charges from the photosensor sections and vertically transfers the read signal charges. The two-layer vertical transfer electrodes have first transfer electrode layers and second transfer electrode layers, and the first transfer electrode layers serve as read electrodes for reading the signal charges from the photosensor sections. The first transfer electrode layers have a larger electrode width with respect to the photosensor sections than the second transfer electrode layers.

16 Claims, 7 Drawing Sheets

SOLID-STATE IMAGING DEVICE, METHOD FOR DRIVING THE SAME, METHOD FOR MANUFACTURING THE SAME, CAMERA, AND METHOD FOR DRIVING THE SAME

CROSS REFERENCES TO RELATED APPLICATIONS

The present invention contains subject matter related to Japanese Patent Application JP 2004-226264 filed in the Japanese Patent Office on Aug. 3, 2004, the entire contents of which are incorporated herein by reference.

BACKGROUND OF THE INVENTION

1. Field of the Invention

The present invention relates to a solid-state imaging device used in apparatuses such as cameras, a method for driving the solid-state imaging device, and a method for manufacturing the solid-state imaging device. The present invention further relates to a camera including the solid-state imaging device and a method for driving the camera.

2. Description of the Related Art

In the related art, image sensors and digital cameras include charge-coupled-device (CCD) solid-state imaging devices of the interline transfer type. A CCD solid-state imaging device includes a two-dimensional array of photosensor sections and a plurality of vertical transfer registers (vertical CCDs) disposed at every column of the photosensor sections. The photosensor sections and the vertical transfer registers constitute an imaging area. The CCD solid-state imaging device further includes a horizontal transfer register (horizontal CCD) and an output section outside the imaging area. In a CCD solid-state imaging device, for example, a CCD solid-state imaging device used in video equipment with a large screen, such as a solid-state imaging device with high output rate used in a high-definition television (HDTV) system, it is necessary to drive the vertical transfer registers at a high rate. It is therefore common to supply clock signals to the vertical transfer registers using low-resistance shunt lines (see, for example, Japanese Unexamined Patent Application Publication No. 6-268192).

FIGS. 5A and 5B show the structure of a CCD solid-state imaging device of the related art having shunt lines. FIG. 5A is a plan view of the CCD solid-state imaging device, showing the main portion thereof, and FIG. 5B is a cross-sectional view of the CCD solid-state imaging device, taken along a line VB-VB of FIG. 5A. While one photosensor section 51 on a surface of a semiconductor substrate (not shown) is shown in FIGS. 5A and 5B, a plurality of photosensor sections 51 is arranged in a two-dimensional array on the semiconductor substrate. The semiconductor substrate has two-layer vertical transfer electrodes formed thereon with a gate insulator film 52 interposed. Each of the vertical transfer electrodes includes a first transfer electrode layer 53 and a second transfer electrode layer 54.

Shunt lines 55 are formed in the first transfer electrode layers 53 and the second transfer electrode layers 54. The shunt lines 55 are made of a low-resistance material, and they are formed in the vertical direction. One of two horizontally adjacent shunt lines 55 includes contact sections 56 electrically connecting this shunt line 55 and the first transfer electrode layers 53, and the other shunt line 55 includes contact sections 57 electrically connecting the other shunt line 55 and the second transfer electrode layers 54. Each of the photosensor sections 51 is a photodiode PD having a PN junction in which a $p^+$-type semiconductor region and an n-type semiconductor region are combined, and the photodiodes PD are separated by channel stops CS.

In the above-described configuration, vertical transfer registers are driven by four-phase driving pulses, and driving pulses $V\phi1$, $V\phi2$, $V\phi3$, and $V\phi4$ shown in FIG. 5A are individually applied to the vertically adjacent first and second transfer electrode layers 53 and 54 via the corresponding shunt lines 55 and the contact sections 56 and 57. In the related art, the driving pulses $V\phi1$, $V\phi2$, $V\phi3$, and $V\phi4$ are applied according to a waveform shown in FIG. 6 so that the second transfer electrode layers 54 read signal charges stored in the photosensor sections 51. In order to reduce a read voltage to be applied to the second transfer electrode layers 54, an electrode width (or readout electrode width) W2 of the second transfer electrode layers 54 is as large as an electrode width W1 of the first transfer electrode layers 53 with respect to the photosensor sections 51.

SUMMARY OF THE INVENTION

Recently, the pixel size has been reduced with an increase in the number of pixels per unit area. The larger the electrode width W2 of the second transfer electrode layers 54, the smaller with respect to the photosensor sections 51 the electrode width W1 of the first transfer electrode layers 53, resulting in a smaller space for the contact sections 56. Thus, hole processing for the contact sections 56 is difficult, and the contact resistance increases, which may cause degradation in vertical transfer efficiency. Conversely, as shown in FIG. 7, the larger the electrode width W1 of the first transfer electrode layers 53, the smaller the electrode width W2 of the second transfer electrode layers 54, leading to a high read voltage to be applied to the second transfer electrode layers 54 for reading the signal charges from the photosensor sections 51. In addition, all necessary signal charges may not be read.

According to an embodiment of the present invention, there is provided a solid-state imaging device including the following elements. A two-dimensional array of photosensor sections on a semiconductor substrate stores signal charges generated by photoelectric conversion. Vertical transfer means including two-layer vertical transfer electrodes reads signal charges from the photosensor sections and vertically transfers the read signal charges. The two-layer vertical transfer electrodes have first transfer electrode layers and second transfer electrode layers, and the first transfer electrode layers serve as read electrodes for reading the signal charges from the photosensor sections. The electrode width of the first transfer electrode layers is larger than the electrode width of the second transfer electrode layers with respect to the photosensor sections.

According to another embodiment of the present invention, there is provided a camera including the above-described solid-state imaging device and a lens disposed in front of the photosensor sections of the solid-state imaging device.

In the solid-state imaging device and the camera according to an embodiment of the present invention, the first transfer electrode layers serve as read electrodes for reading the signal charges from the photosensor sections, and the electrode width of the first transfer electrode layers is larger than that of the second transfer electrode layers with respect to the photosensor sections. Thus, when the shunt lines are formed on the vertical transfer electrodes, a large read electrode width for reading signal charges from the photosensor sections and a large structural space for the contacts connecting the first transfer electrode layers and the shunt lines can be maintained.

With a large electrode width of the read electrodes for reading signal charges from the photosensor sections and a large space for the contacts, the solid-state imaging device and the camera according to an embodiment of the present invention can address the reduction in pixel size.

DESCRIPTION OF THE PREFERRED EMBODIMENTS

Specific embodiments of the present invention will be described in detail hereinafter with reference to the drawings.

Figure 1:
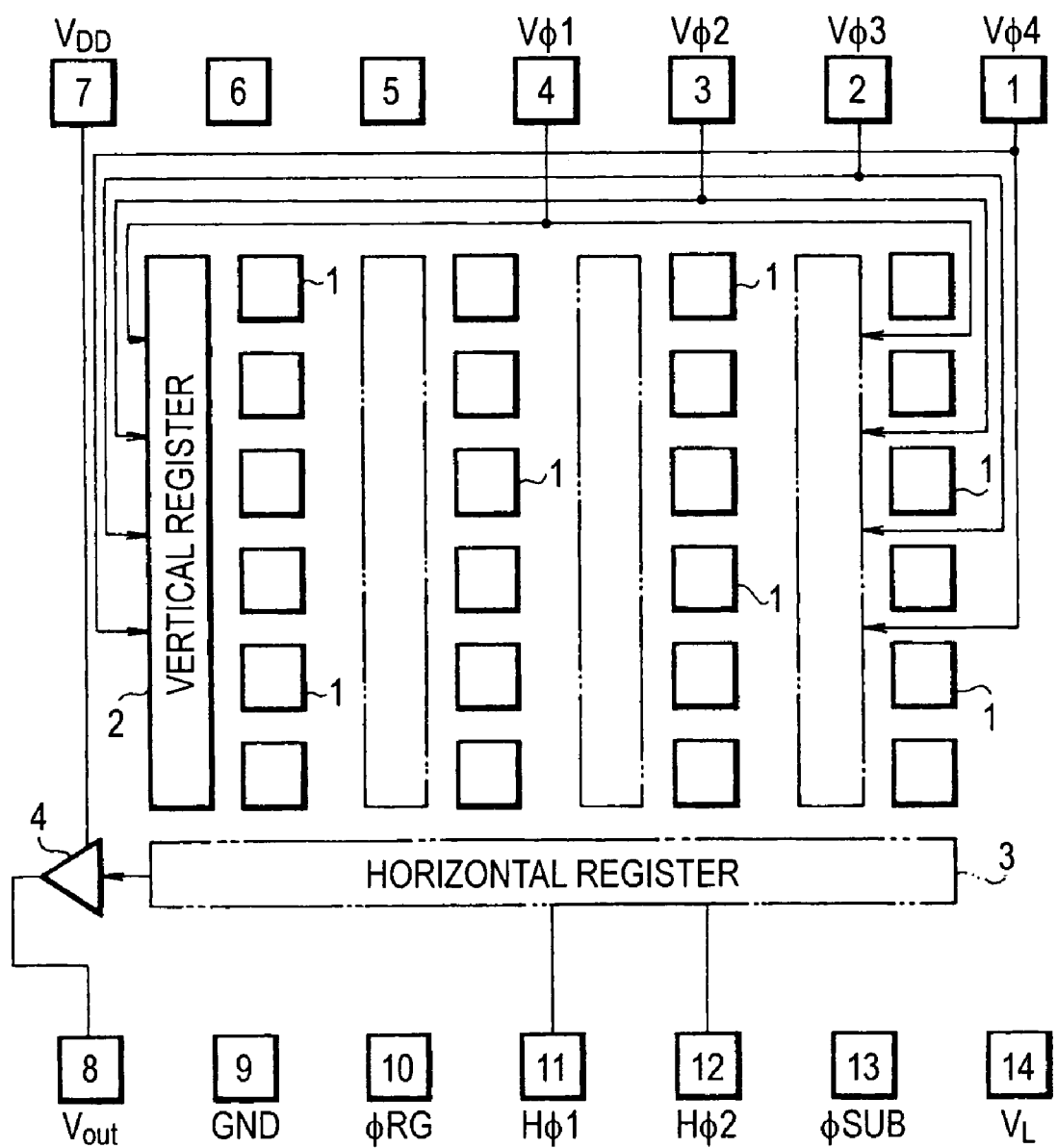
FIG. 1 is a schematic diagram of a CCD solid-state imaging device, to which an embodiment of the present invention is applied.

FIG. 1 schematically shows a CCD solid-state imaging device, to which an embodiment of the present invention is applied. In FIG. 1, a two-dimensional array of photosensor sections 1 is arranged in an imaging area of the CCD solid-state imaging device. Each of the photosensor sections 1 has a photoelectric conversion function for generating a signal charge according to the amount of incident light and a charge storage function for storing the signal charge generated by photoelectric conversion. In the imaging area, a plurality of vertical transfer registers 2 also are disposed along the vertical axis with respect to the photosensor sections 1. The vertical transfer registers 2 have a structure in which a plurality of metal-oxide-semiconductor (MOS) capacitors (not shown) is vertically adjacent, and driving pulses are individually applied to the MOS capacitors. Each of the vertical transfer registers 2 is disposed adjacently at every column of the photosensor sections 1. The vertical transfer registers 2 are vertical CCDs vertically transferring the signal charges read from the corresponding columns of the photosensor sections 1 in a sequential manner.

A horizontal transfer register 3 is disposed along the horizontal axis at an end of the vertical transfer registers 2. The horizontal transfer register 3 is a horizontal CCD horizontally transferring the signal charges vertically transferred by the vertical transfer registers 2. The signal charges are transferred from the horizontal transfer register 3 to an output amplifier 4. The output amplifier 4 converts the signal charges transferred by the horizontal transfer register 3 into a voltage and outputs the voltage.

A plurality of pads for driving pulses $V\phi 1$, $V\phi 2$, $V\phi 3$, and $V\phi 4$ for vertical transfer, a power supply voltage $V_{DD}$, an output signal $V_{out}$, a ground GND, a reset gate driving pulse $\phi RG$, driving pulses $H\phi 1$ and $H\phi 2$ for horizontal transfer, an electronic shutter pulse $\phi SUB$, and electrostatic protection $V_L$ also are disposed around the imaging area. The driving pulses $V\phi 1$, $V\phi 2$, $V\phi 3$, and $V\phi 4$ for vertical transfer are supplied to transfer electrodes (described below) of the vertical transfer registers 2, and the driving pulses $H\phi 1$ and $H\phi 2$ for horizontal transfer are supplied to a transfer electrode of the horizontal transfer register 3.

Figure 2A:
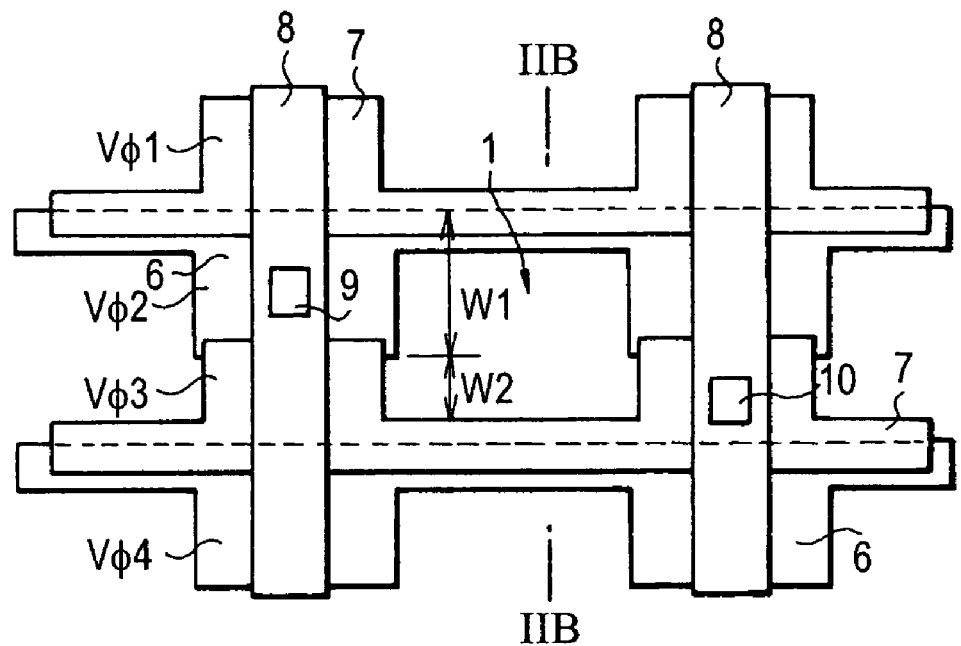
FIG. 2A is a plan view of a solid-state imaging device according to an embodiment of the present invention.
Figure 2B:
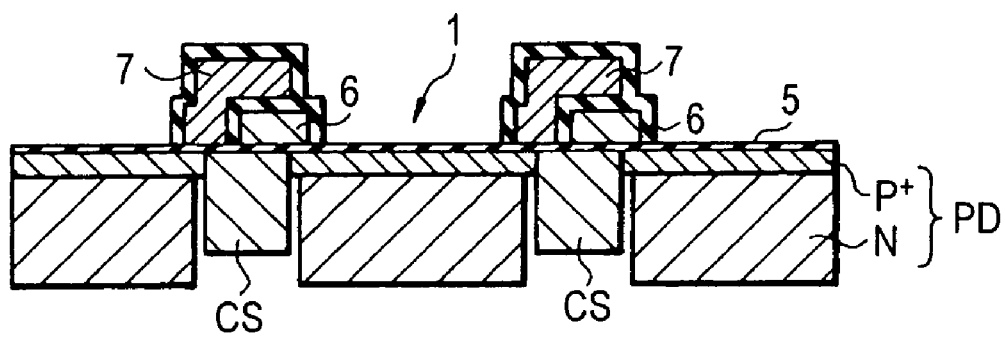
FIG. 2B is a cross-sectional view of the solid-state imaging device, taken along a line IIB-IIB of FIG. 2A.

FIGS. 2A and 2B show the structure of a solid-state imaging device according to an embodiment of the present invention. FIG. 2A is a plan view of the solid-state imaging device, showing the main portion thereof, and FIG. 2B is a cross-sectional view of the solid-state imaging device, taken along a line IIB-IIB of FIG. 2A. In FIGS. 2A and 2B, photosensor sections 1 are arranged in a two-dimensional array on a surface of a semiconductor substrate (not shown) formed of a P-type silicon substrate, and they are provided for pixels in one-to-one correspondence in the vertical and horizontal directions. Each of the photosensor sections 1 may be a photodiode PD having a PN junction in which a $p^+$-type semiconductor region and a n-type semiconductor region are combined, and the photodiodes PD are separated by channel stops CS.

A method for manufacturing a solid-state imaging device and a camera according to an embodiment of the present invention now will be described.

A method for manufacturing a solid-state imaging device according to an embodiment of the present invention includes the steps of forming a two-dimensional array of photosensor sections on a semiconductor substrate and forming vertical transfer means including two-layer vertical transfer electrodes for reading signal charges from the photosensor sections and vertically transferring the read signal charges. The two-layer vertical transfer electrodes have first transfer electrode layers and second transfer electrode layers, and the first transfer electrode layers serve as read electrodes for reading the signal charges from the photosensor sections. The electrode width of the first transfer electrode layers is larger than that of the second transfer electrode layers with respect to the photosensor sections.

A method for manufacturing a camera according to an embodiment of the present invention further includes a step of forming a lens in front of the photosensor sections of the solid-state imaging device in addition to the steps described above.

The vertical transfer electrodes have shunt lines formed thereon. Each of the shunt lines is made of a material having a lower sheet resistance than polycrystalline silicon. The first transfer electrode layers and the second transfer electrode layers are shifted with respect to each other in the vertical direction between the photosensor sections that are vertically adjacent. The shunt lines are formed one-by-one between the photosensor sections that are arranged in the horizontal direction with a predetermined pitch.

A first shunt line in the shunt lines includes first contact sections electrically connecting the first shunt line and the first transfer electrode layers, and a second shunt line in the shunt lines includes second contact sections electrically connecting the second shunt line and the second transfer electrode layers. The first and second contact sections are offset by about half a pixel in the vertical direction.

The semiconductor substrate has two-layer vertical transfer electrodes formed thereon with a gate insulator film 5 interposed, e.g., silicon dioxide ($SiO_2$). The two-layer vertical transfer electrodes correspond to the vertical transfer registers 2 shown in FIG. 1, and they include first transfer electrode layers 6 and second transfer electrode layers 7 formed thereafter. The transfer electrode layers 6 and 7 are made of polycrystalline silicon, and they are formed so as to surround the photosensor sections 1, when viewed two-dimensionally. Each of the transfer electrode layers 6 and 7 is coated with an insulator film.

Shunt lines 8 extend in the first transfer electrode layers 6 and the second transfer electrode layers 7. The shunt lines 8 are made of a material having a lower sheet resistance than polycrystalline silicon, such as aluminum or tungsten, and extend vertically in the vertical transfer registers 2. The shunt lines 8 are disposed one-by-one between photosensor sections 1 arranged in the horizontal direction with a predetermined pitch. One of two horizontally adjacent shunt lines 8 includes contact sections 9 electrically connecting this shunt line 8 and the first transfer electrode layers 6, and the other shunt line 8 includes contact sections 10 electrically connecting the other shunt line 8 and the second transfer electrode layers 7. The contact sections 9 and 10 are offset by about half a pixel in the vertical direction. As shown in FIG. 1, if the vertical transfer registers 2 are driven by four-phase driving pulses $V\phi 1$, $V\phi 2$, $V\phi 3$, and $V\phi 4$, the contact sections 9 and the contact sections 10 are provided for every four pixels in the horizontal direction.

Figure 3A:
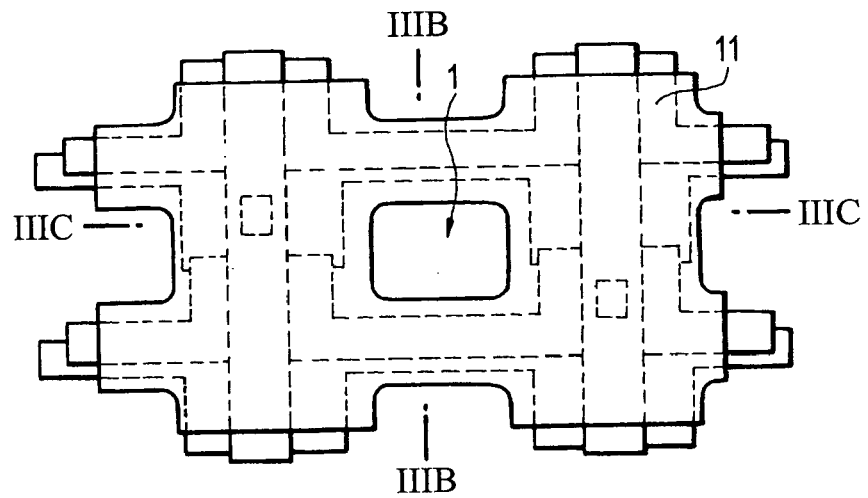
FIG. 3A is a plan view of the solid-state imaging device having a light shielding film.
Figure 3B:
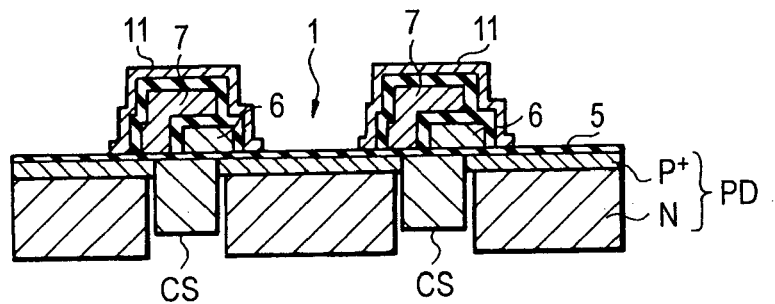
FIGS. 3B and 3C are cross-sectional views of the solid-state imaging device, taken along lines IIIB-IIIB and IIIC-IIIC of FIG. 3A, respectively.
Figure 3C:
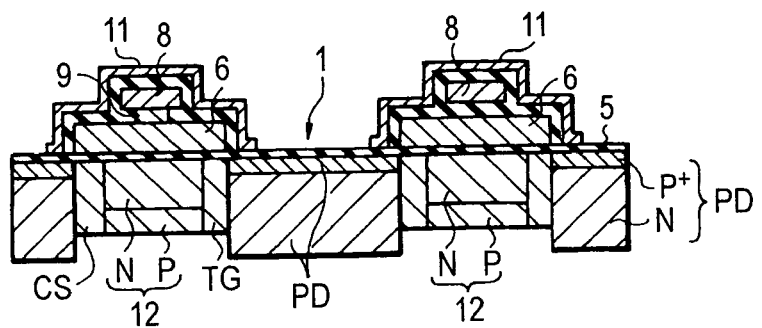

Although not shown in FIGS. 2A and 2B, which show the fundamental configuration of the solid-state imaging device, a light shielding film is actually formed. FIGS. 3A to 3C show the structure of the solid-state imaging device having a light shielding film 11. FIG. 3A is a plan view of the solid-state imaging device, showing the main portion thereof, FIG. 3B is a cross-sectional view of the solid-state imaging device, taken along a line IIIB-IIIB of FIG. 3A, and FIG. 3C is a cross-sectional view of the solid-state imaging device, taken along a line IIIC-IIIC of FIG. 3A. The light shielding film 11 has openings from which the photosensor sections 1 are exposed. In FIG. 3C, vertical CCDs 12 are disposed between the photodiodes PD with the channel stops CS and read gates TG interposed. Each of the vertical CCDs 12 has a PN junction in which a n-type semiconductor region and a p-type semiconductor region are combined.

Figure 4:
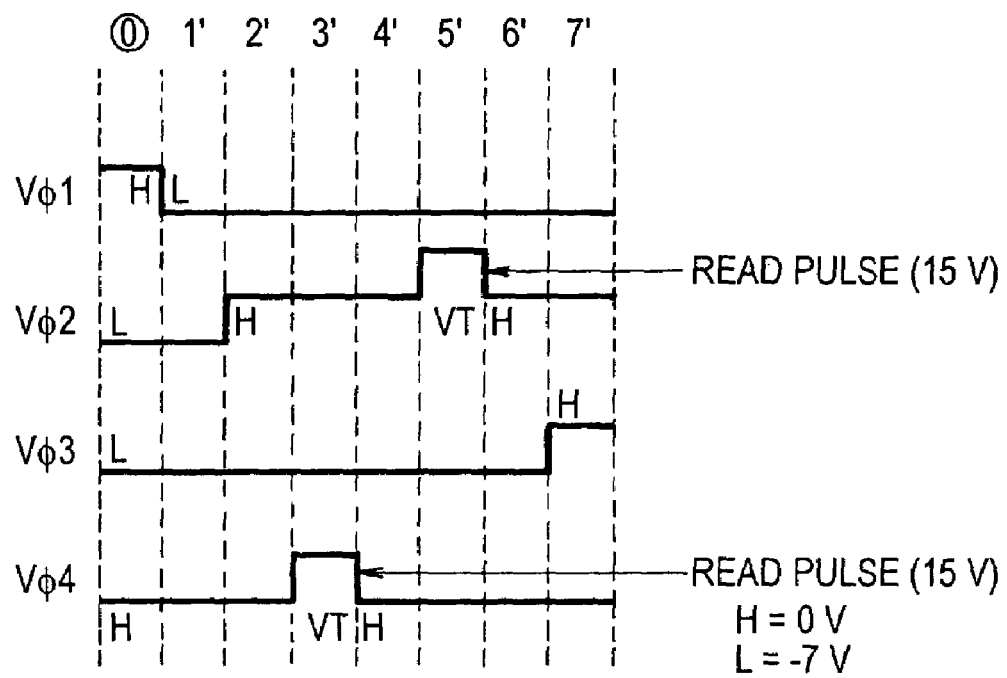
FIG. 4 is a waveform of driving pulses for vertical transfer according to an embodiment of the present invention.
Figure 5A:
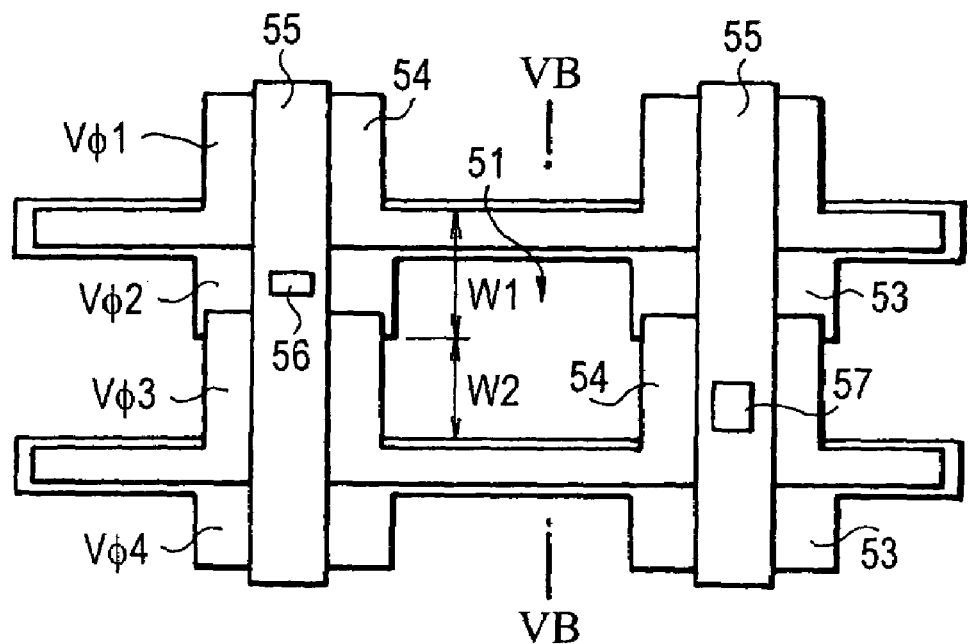
FIG. 5A is a plan view of a CCD solid-state imaging device of the related art.
Figure 5B:
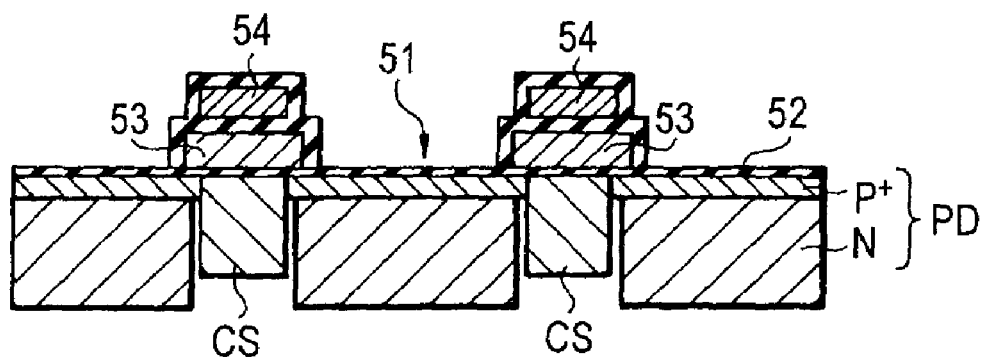
FIG. 5B is a cross-sectional view of the CCD solid-state imaging device of the related art, taken along a line VB-VB of FIG. 5A.
Figure 6:
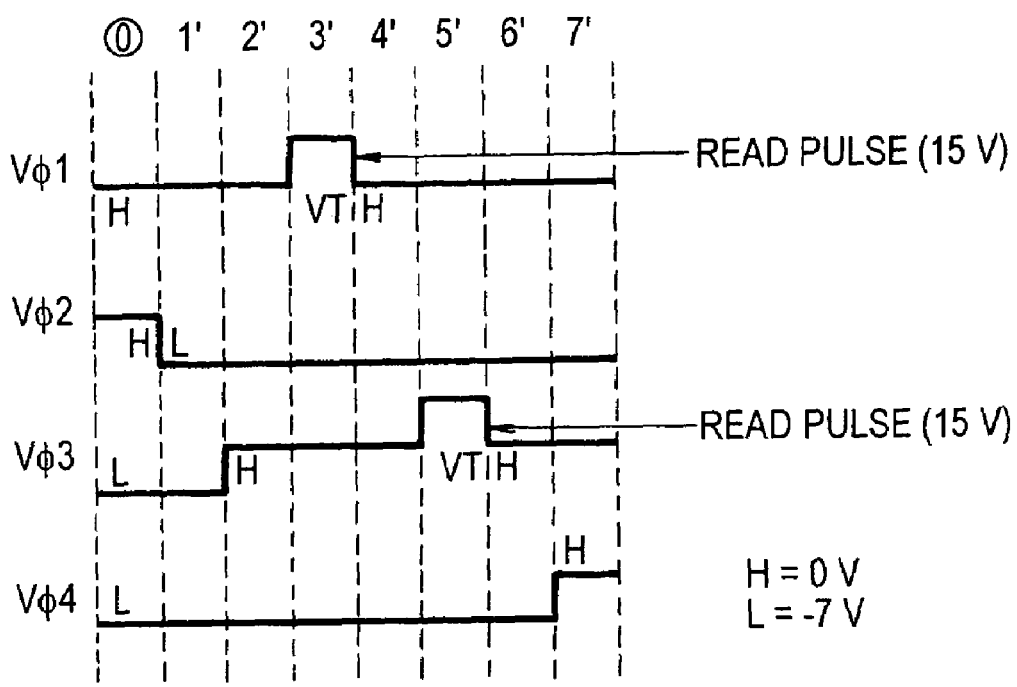
FIG. 6 is a waveform of driving pulses for vertical transfer in the related art.
Figure 7:
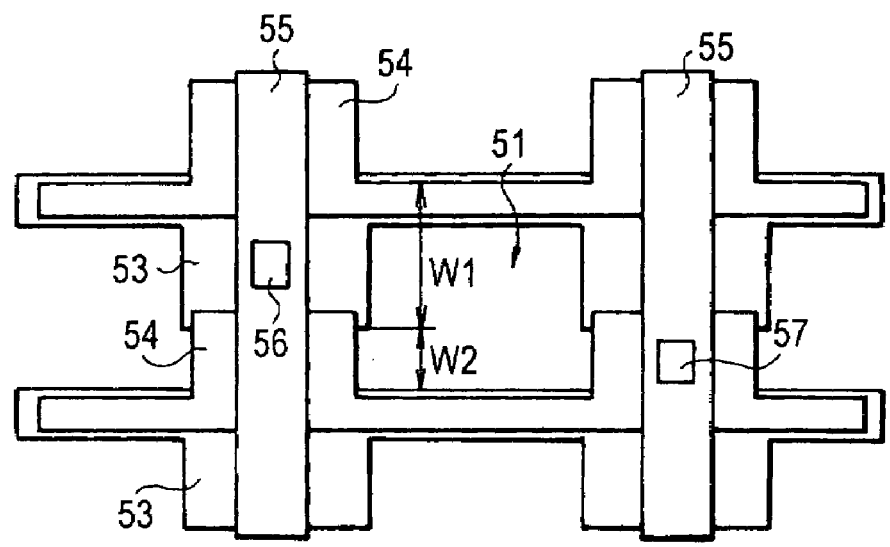
FIG. 7 is a diagram of another CCD solid-state imaging device of the related art.

In an embodiment of the present invention, the first transfer electrode layers 6 are read electrodes for reading signal charges from the photosensor sections 1, and an electrode width W1 of the first transfer electrode layers 6 serving as read electrodes is larger than an electrode width W2 of the second transfer electrode layers 7. Driving pulses $V\phi 1$, $V\phi 2$, $V\phi 3$, and $V\phi 4$ for vertical transfer having a waveform shown in FIG. 4 are applied to the transfer electrode layers 6 and 7 in the manner shown in FIG. 2A, and read pulses are supplied to the first transfer electrode layers 6, thereby reading signal charges from the photosensor sections 1 to the vertical transfer registers 2. Specifically, the driving pulses $V\phi 1$, $V\phi 2$, $V\phi 3$, and $V\phi 4$ for vertical transfer may be pulses having three levels of, for example, 15 V, 0 V, and −7 V. Among them, the pulses of 0 V and −7 V are used for transferring signal charges and the pulses of 15 V are used for reading signal charges. The driving pulses V+2 and V+4 to be applied to the first transfer electrode layers 6 that are vertically adjacent become read pulses of 15 V at individual predetermined timings, and signal charges are read from the photosensor sections 1 to the vertical transfer registers 2 in response to these read pulses.

The electrode width W1 of the first transfer electrode layers 6 represents the electrode length in the vertical direction of the first transfer electrode layers 6 contacted with the gate oxide film 5 in a portion adjacent to the photosensor sections 1. The electrode width W2 of the second transfer electrode layers 7 represents the electrode length in the vertical direction of the second transfer electrode layers 7 contacted with the gate oxide film 5 in a portion adjacent to the photosensor sections 1. Since the second transfer electrode layers 7 are stacked on the first transfer electrode layers 6, a portion of the second transfer electrode layers 7 which overlaps the first transfer electrode layers 6 is not contacted with the gate oxide film 5.

Figure 8:
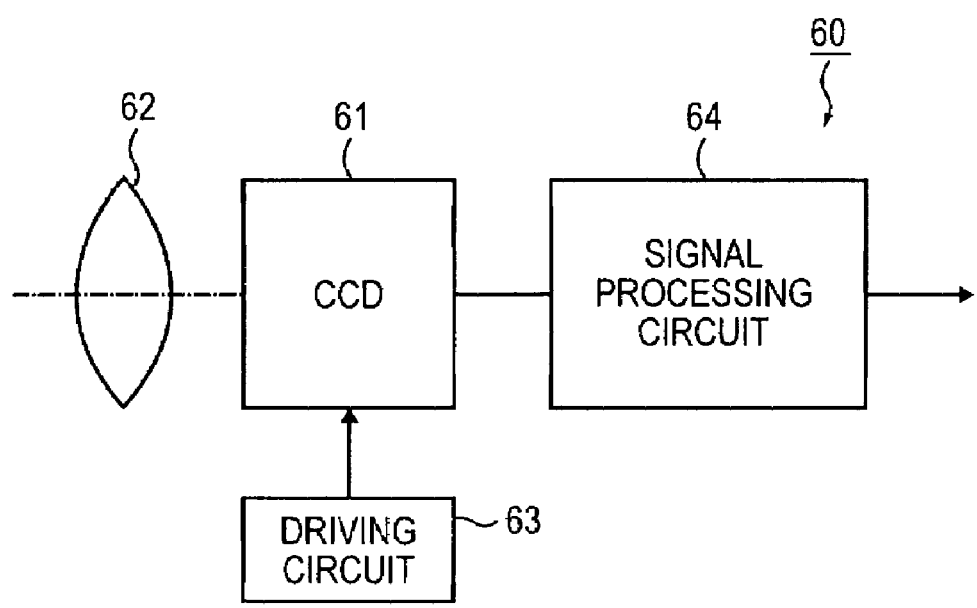
FIG. 8 is a schematic diagram of a camera according to an embodiment of the present invention.

FIG. 8 is a schematic block diagram of a camera 60 including the above-described solid-state imaging device.

The camera 60 includes a solid-state imaging device (CCD) 61, an optical system 62, a driving circuit 63, and a signal processing circuit 64.

The optical system 62 focuses image light (or incident light) reflected from an object onto an imaging surface of the solid-state imaging device 61. In the solid-state imaging device 61, the photosensor sections 1 convert the incident light into signal charges according to the amount of incident light and store the signal charges in signal charge storage regions of the photosensor sections 1 for a certain period of time.

The driving circuit 63 supplies timing signals, e.g., the above-described four-phase clock signals $V\phi 1$, $V\phi 2$, $V\phi 3$, and $V\phi 4$ and two-phase clock signals $H\phi 1$ and $H\phi 2$, to the solid-state imaging device 61. In response to these timing signals, the solid-state imaging device 61 is driven to read, vertically transfer, and horizontally transfer the signal charges. Then, an analog image signal is output from an output unit of the solid-state imaging device 61.

The signal processing circuit 64 performs signal processing, such as noise rejection and conversion into a digital signal, on the analog signal output from the solid-state imaging device 61. The signal subjected to signal processing by the signal processing circuit 64 is stored in a storage medium, such as a memory.

Since the solid-state imaging device 61, which provides a low read voltage, is used in the camera 60, e.g., a video camera or a digital still camera, the camera 60 can provide low power consumption.

With the above-described electrode structure, the electrode width for reading signal charges from the photosensor sections 1 corresponds to the electrode width W1 of the first transfer electrode layers 6, wherein the electrode width W1 is relatively larger than the electrode width W2 of the second transfer electrode layers 7. Thus, the voltage of read pulses to be applied for reading the signal charges can be reduced. Moreover, a large space for the contact sections 9 electrically connecting the first transfer electrode layers 6 and the shunt lines 8 facilitates hole processing for the contact sections 9, while reducing the contact resistance. The electrode structure described above can therefore address the reduction in pixel size.

In a region defined by the vertically adjacent photosensor sections 1, the second transfer electrode layers 7 are formed on the first transfer electrode layers 6 so that the first transfer electrode layers 6 and the second transfer electrode layers 7 are shifted with respect to each other in the vertical direction, and a portion of the second transfer electrode layers 7 is contacted with the gate oxide film 5. Thus, the electrode width (cross-section area) of the second transfer electrode layers 7 between the photosensor sections 1 in the vertical direction is large, and the electrode resistance is reduced. In this structure, as shown in the waveform shown in FIG. 4, when a positive read pulse is applied to the first transfer electrode layers 6, a pulse of 0 V or a pulse of negative voltage is applied to the second transfer electrode layers 7. A potential barrier between the photosensor sections 1 in the vertical direction can prevent the mixture of the signal charges (color mixture) between the pixels in the vertical direction.

It should be understood by those skilled in the art that various modifications, combinations, subcombinations and alterations may occur depending on design requirements and other factors insofar as they are within the scope of the appended claims or the equivalents thereof.

What is claimed is:

1. A solid-state imaging device comprising:
   a two-dimensional array of photosensor sections on a semiconductor substrate for storing signal charges generated by photoelectric conversion; and
   vertical transfer means including two-layer vertical transfer electrodes for reading signal charges from the photosensor sections and vertically transferring the read signal charges,
   wherein the two-layer vertical transfer electrodes have first transfer electrode layers and second transfer electrode layers, the first transfer electrode layers serve as read electrodes for reading the signal charges from the photosensor sections, and the first transfer electrode layers have a larger electrode width with respect to the photosensor sections than the second transfer electrode layers.

2. The solid-state imaging device according to claim 1, wherein the two-layer vertical transfer electrodes include shunt lines.

3. The solid-state imaging device according to claim 2, wherein each of the shunt lines is made of a material having a lower sheet resistance than polycrystalline silicon.

4. The solid-state imaging device according to claim 2, wherein the shunt lines are formed one-by-one between the photosensor sections that are arranged in the horizontal direction with a predetermined pitch.

5. The solid-state imaging device according to claim 2, wherein a first shunt line in the shunt lines includes first contact sections electrically connecting the first shunt line and the first transfer electrode layers, and a second shunt line in the shunt lines includes second contact sections electrically connecting the second shunt line and the second transfer electrode layers, the first contact sections and the second contact sections being offset by about half a pixel in the vertical direction.

6. The solid-state imaging device according to claim 1, wherein the first transfer electrode layers and the second transfer electrode layers are shifted with respect to each other in the vertical direction between the photosensor sections that are vertically adjacent.

7. A method for driving a solid-state imaging device including a two-dimensional array of photosensor sections on a semiconductor substrate for storing signal charges generated by photoelectric conversion, and vertical transfer means including two-layer vertical transfer electrodes for reading signal charges from the photosensor sections and vertically transferring the read signal charges, wherein the two-layer vertical transfer electrodes have first transfer electrode layers and second transfer electrode layers, and the first transfer electrode layers have a larger electrode width with respect to the photosensor sections than the second transfer electrode layers,
   the method comprising a step of reading signal charges from the photosensor sections by applying read pulses to the first transfer electrode layers.

8. A camera comprising:
   a solid-state imaging device including a two-dimensional array of photosensor sections on a semiconductor substrate for storing signal charges generated by photoelectric conversion, and vertical transfer means including two-layer vertical transfer electrodes for reading signal charges from the photosensor sections and vertically transferring the read signal charges, wherein the two-layer vertical transfer electrodes have first transfer electrode layers and second transfer electrode layers, the first transfer electrode layers serve as read electrodes for reading the signal charges from the photosensor sections, and the first transfer electrode layers have a larger electrode width with respect to the photosensor sections than the second transfer electrode layers; and
   a lens disposed in front of the photosensor sections of the solid-state imaging device.

9. The camera according to claim 8, wherein the vertical transfer electrodes include shunt lines.

10. The camera according to claim 9, wherein each of the shunt lines is made of a material having a lower sheet resistance than polycrystalline silicon.

11. The camera according to claim 9, wherein the shunt lines are formed one-by-one between the photosensor sections that are arranged in the horizontal direction with a predetermined pitch.

12. The camera according to claim 9, wherein a first shunt line in the shunt lines includes first contact sections electrically connecting the first shunt line and the first transfer electrode layers, and a second shunt line in the shunt lines includes second contact sections electrically connecting the second shunt line and the second transfer electrode layers, the first contact sections and the second contact sections being offset by about half a pixel in the vertical direction.

13. The camera according to claim 8, wherein the first transfer electrode layers and the second transfer electrode layers are shifted with respect to each other in the vertical direction between the photosensor sections that are vertically adjacent.

14. A method for driving a camera including a solid-state imaging device, the solid-state imaging device including a two-dimensional array of photosensor sections on a semiconductor substrate for storing signal charges generated by photoelectric conversion, vertical transfer means including two-layer vertical transfer electrodes for reading signal charges from the photosensor sections and vertically transferring the read signal charges, wherein the two-layer vertical transfer electrodes have first transfer electrode layers and second transfer electrode layers, and the first transfer electrode layers have a larger electrode width with respect to the photosensor sections than the second transfer electrode layers,
   the method comprising a step of reading signal charges from the photosensor sections by applying read pulses to the first transfer electrode layer when driving the solid-state imaging device.

15. A solid-state imaging device comprising:
   a two-dimensional array of photosensor sections on a semiconductor substrate storing signal charges generated by photoelectric conversion; and a vertical transfer section including two-layer vertical transfer electrodes reading signal charges from the photosensor sections and vertically transferring the read signal charges, wherein the two-layer vertical transfer electrodes have first transfer electrode layers and second transfer electrode layers, the first transfer electrode layers serve as read electrodes for reading the signal charges from the photosensor sections, and the first transfer electrode layers have a larger electrode width with respect to the photosensor sections than the second transfer electrode layers.

16. A camera comprising:

a solid-state imaging device including a two-dimensional array of photosensor sections on a semiconductor substrate storing signal charges generated by photoelectric conversion, and a vertical transfer section including two-layer vertical transfer electrodes reading signal charges from the photosensor sections and vertically transferring the read signal charges, wherein the two-layer vertical transfer electrodes have first transfer electrode layers and second transfer electrode layers, the first transfer electrode layers serve as read electrodes for reading the signal charges from the photosensor sections, and the first transfer electrode layers have a larger electrode width with respect to the photosensor sections than the second transfer electrode layers; and a lens disposed in front of the photosensor sections of the solid-state imaging device.

* * * * *